(12) United States Patent
Zjajo

(10) Patent No.: US 8,497,792 B2
(45) Date of Patent: Jul. 30, 2013

(54) SIGNAL GENERATION METHOD AND APPARATUS AND TEST METHOD AND SYSTEM USING THE SAME

(75) Inventor: Amir Zjajo, Eindhoven (NL)

(73) Assignee: NXP B.V., Eindhoven (NL)

( * ) Notice: Subject to any disclaimer, the term of this patent is extended or adjusted under 35 U.S.C. 154(b) by 25 days.

(21) Appl. No.: 13/057,759

(22) PCT Filed: Aug. 5, 2009

(86) PCT No.: PCT/IB2009/053412
§ 371 (c)(1),
(2), (4) Date: Apr. 26, 2011

(87) PCT Pub. No.: WO2010/016019
PCT Pub. Date: Feb. 11, 2010

(65) Prior Publication Data
US 2011/0187421 A1    Aug. 4, 2011

(30) Foreign Application Priority Data
Aug. 7, 2008    (EP) .................................... 08104984

(51) Int. Cl.
*H03M 1/00*    (2006.01)
(52) U.S. Cl.
USPC .......................................... 341/139; 341/120
(58) Field of Classification Search
USPC ................................................ 341/120, 139
See application file for complete search history.

(56) References Cited

U.S. PATENT DOCUMENTS

| | | | |
|---|---|---|---|
| 3,863,158 A | 1/1975 | Kupersmith et al. | |
| 4,142,245 A | 2/1979 | Baron | |
| 4,458,216 A | 7/1984 | Bingham | |
| 4,740,995 A | 4/1988 | Schevin | |
| 5,166,540 A | 11/1992 | Park | |
| 5,461,583 A | 10/1995 | Fensch et al. | |
| 5,504,445 A | 4/1996 | Miki | |
| 7,215,202 B2 * | 5/2007 | Al-Shyoukh et al. | ......... 330/279 |
| 7,492,296 B1 * | 2/2009 | Drakshapalli et al. | ........ 341/139 |
| 2003/0093730 A1 | 5/2003 | Halder et al. | |

OTHER PUBLICATIONS

Lu, A.K., et al.; A High Quality Analog Oscillator Using Oversampling D/A Conversion Techniques; IEEE Trans on Circuits and Systems II: Analog and Digitial Processing, vol. 41, No. 7; pp. 437-444 (Jul. 1994).

(Continued)

*Primary Examiner* — Khai M Nguyen

(57) ABSTRACT

According to a first aspect of the present invention there is provided a signal generation system for generating a predetermined analog signal. The system comprises a clock generator (1) adapted for generating on the basis of an external clock signal a predetermined clock signal, a signal generator including a first gain stage (21) and a second gain stage (22) adapted for providing an overall gain of the signal generator and outputting a stepped analog signal, an analog filter (23) adapted for filtering the stepped analog signal output by the second gain stage and for outputting the predetermined analog signal, and a first and a second clock mapping units (3,4) adapted for receiving the predetermined clock signal, and respectively supplying to the first and second gain stages non-overlapped clock signal, wherein the amount of gain provided by the first and second gain stages is controlled by the non-overlapped clock signals. The present invention further relates to a signal generation method of generating discrete-time periodic analog signals suitable for a built-in self-test, as well as to a test method and system using the same.

20 Claims, 12 Drawing Sheets

OTHER PUBLICATIONS

Chang, G., et al; "A Low-Power CMOS Digitally-Synthesized 0-13MHz Agile Sinewave Generator"; IEEE Intl Solid-State Circuits; p. 32-33 (1994).

Dufort, Benoit, et al; On-Chip Analog Signal Generation for Mixed-Signal Built-In-Self-Test; IEEE Journal of Solid-State Circuits, vol. 34, No. 3; pp. 318-3330 (Mar. 1999).

Huang, Jiun-Lang, et al.; "A Sigma-Delta Modulation Based BIST Scheme for Mixed-Signal Circuits"; IEEE Design Automation Conference; pp. 605-610 (2000).

Chang, Yeong-Jar, et al.; "Built-In High Resloution Signal Generator for Testing ADC and DAC" IEEE, Piscataway, NJ, US; pp. 231-234 (2003).

Mendez-Rivera, Marcia G., et al.; "An On-Chip Spectrum Analyzer for Analog Built-In Testing"; Journal of Electronic Testing; Theory and Applications; Kluwer Academic Publisher, BO; vol. 21, No. 3; pp. 205-219 (Jun. 1, 2005).

Galan, J., et al; "A Low-Power Low-Voltage OTA-C Sinusoidal Oscillator With a Alrge Tuning Range"; IEEE Transactions on Circuits and Sytems—1: Regular Papers, vol. 52, No. 2 (Feb. 2005).

Barragan, Manuel J., et al; "On-Chip Analog Sinewave Generator With Reduced Circuitry Resources"; Circuits and Systems, $49^{th}$ IEEE Intl Midwest Symposium on; pp. 638-642 (Aug. 1, 2006).

Barragan, Manuel J., et al; "Practiacal Implementation of a Network Analyzer for Analog BIST Applications"; Design, Automation and Test in Europe; IEEE, Piscataway, NJ, US; pp. 80-85 (Mar. 10, 2008).

International Search Report and Written Opinion for Application PCT/IB2009/053412 (Feb. 9, 2010).

* cited by examiner

SIGNAL GENERATION METHOD AND APPARATUS AND TEST METHOD AND SYSTEM USING THE SAME

FIELD OF THE INVENTION

The present invention relates to a signal generation system and method of generating discrete-time periodic analog signals suitable for a built-in self-test BIT, as well as to a test method and system using the same.

BACKGROUND OF THE INVENTION

Nowadays, the constant evolution of the integration capability in CMOS technologies is making possible the development of complex-mixed signal SoC (SoC: System on Chip). This increasing complexity has the associated issue of more complex and hence more expensive test. This issue in view of testing is identified in the SIA roadmap for semiconductors as one of the key problems for present and future mixed-signal SoCs. Regarding the analog parts thereof, usually the test of these parts represents the main bottleneck in this line. Analog circuits are usually tested using functional approaches, often requiring a large data volume processing, high accuracy and high speed ATEs (ATE: Automatic Test Equipment). In addition, these analog parts or analog cores are normally very sensitive to noise and loading effects, which limit the internal monitoring and make their test a difficult task.

Built-in self-test schemes (BIST schemes) have been proved to be a solution to the problems cited above. These BIST schemes consist on a moving part of the required test resources (test stimuli generation, response evaluation, test control circuitry, etc.) from the ATE to the chip including the analog cores. The use of the built-in self-test techniques (BIST techniques) can make a significant difference in terms of test time and costs in comparison to traditional testing with off-chip equipment. The diversity of analog circuit design, the multitude of their performance parameters and their limited observability, make analog and mixed-signal circuit BIST a very challenging problem compared to pure digital circuit BIST. Performing the built-in characterization of all the possible parameters would completely avoid the need of external testing, but the required design time and silicon area overhead would often make that option unaffordable. Nevertheless, a reduction of the testing time, through the built-in aided test of a sub-set of the performance parameters of a mixed-signal IC can positively influence the final costs of the chip.

The on-chip evaluation and generation of periodic signals are of undoubted interest from this point of view. They have wide potential applications in the field of mixed-signal testing as most of these systems (filters, analog-to-digital converters ADCs, digital-to-analog converters DACs, signal conditioners, etc.) can be characterized and tested (frequency domain specification, linearity, etc.) using this kind of stimuli.

Regarding the prior art, reference U.S. Pat. No. 4,740,995 discloses a variable frequency sinusoidal signal generator, in particular for a modem, including a clock generator, a complex digital/analog converter (DAC) based on a R-2R (or C-2C) architecture, and having a frequency variable as a function of a selection signal applied to the generator. The clock generator for outputting a plurality of clock signals having variable frequencies is programmable as a function of a selection signal which constitutes an external signal. Based on reference voltages, and in conjunction with the clock signals utilized as sampling signals a step signal is created having a sinusoidal envelope. The fundamental frequency is a function of the clock signal. The sinusoidal envelope is extracted by a low pass filter section having an adjustable transfer function. The filter section further includes a plurality of capacitors, and switching means is provided for sampling the capacitors at a sampling rate which is a function of the sampling frequency of the digital-to-analog converter. A plurality of capacitors is used for defining particular values of the waveform. The generator can be used in modulators/demodulators or modems for transmitting binary signals on a telephone line.

Moreover, conventional sine wave signal generation methods rely on (i) an analog oscillator consisting of a filtering section and a non-linear feedback mechanism, or (ii) by adapting digital techniques using the scheme and block structure shown in FIG. 12, which facilitates a digital interface for control and programming tasks.

(i) a non-linear feedback mechanism forces the oscillation while the filtering section removes the unwanted harmonics. The quality of the generated signal depends on the linearity and selectivity of the filter (the larger the selectivity is, the larger the purity of the sign signal) and the shape of the non-linear function (smooth functions are needed for low distortion, which requires a lot of area and power. The tuning of the filter allows the programmability of the frequency.

(ii) a direct implementation using memory based synthesizers is not practical because of the area overhead. In conventional systems it is avoided the use of the DAC by exploiting the noise shaping characteristics of EA encoding schemes. They consist of generating a 1-bit stream $\Sigma\Delta$ encoded version of a N-bit digital signal and match the shape of a filter with the noise shaping characteristics of the encoded bit stream.

As is shown in FIG. 12, an external tester A includes a test activation and control device B. The box C refers to the on-chip signal generation, which involves a digital generator D, a D/A-converter E, an analog filter F as well as the specific device under test (DUT) G.

It is valid for single and multitone signals but requires bit-stream lengths and a highly selective filter to remove the noise. In addition, the approach is frequency limited due to the end of the very high over sampling ratios.

SUMMARY OF THE INVENTION

It is therefore an object of the present invention to provide a signal generation system and method of generating analog signals suitable for a built-in self-test with minimal circuitry resources to ensure reduced area overhead.

According to the present invention, this object is accomplished by a signal generation system and method of generating analog signals suitable for a built-in self-test BIT, as well as to a test method and a test system using the same, as set out in the appended claims.

According to a first aspect of the present invention, there is provided a signal generation system for generating a predetermined analog signal. The system comprises a clock generator adapted for generating on the basis of an external clock signal a predetermined clock signal, a signal generator including a first gain stage and a second gain stage adapted for providing an overall gain of the signal generator and outputting a stepped analog signal, an analog filter adapted for filtering the stepped analog signal output by the second gain stage and for outputting the predetermined analog signal, and a first and a second clock mapping units adapted for receiving the predetermined clock signal, and respectively supplying to the first and second gain stages non-overlapped clock signal, wherein the amount of gain provided by the first and second gain stages is controlled by the non-overlapped clock signals.

According to a second aspect of the present invention, there is provided a method of generating a predetermined analog signal. The method comprises the steps of: generating, on the basis of an external clock signal, a predetermined clock signal, generating, based on the predetermined clock signal, non-overlapped clock signals, providing an overall gain of a signal generator based on the non-overlapped clock signals and outputting a stepped analog signal, filtering the stepped analog signal and outputting the predetermined analog signal, and controlling the overall gain of the signal generator on the basis of the non-overlapped clock signals.

The signal generation system and the corresponding generation method according to the first and second aspects of the present invention allow discrete-time periodic analog signal generation, and in essence, show how a programmable gain amplifier (PGA) plays the role of the DAC shown in FIG. 12, and further show where each gain step represents a value of a sampled and hold signal. The main advantages of the approach are that both the amplitude and the frequency of the signal can easily be controlled by a DC input voltage and the clock frequency, respectively, together with the simplicity and robustness of the logic and the switched-capacitor (SC) or Gm-C circuitry. Additionally, the method is further improved by the use of a linear time-variant filter (analog filter), where both operations of final signal generation and filtering are merged in the filter itself. The proposed approach maintains the attributes of digital control, programmability and robustness, and reduces significantly the area overhead with respect to the other discussed approaches. Moreover, the proposed structures include the simplicity in design methodology, the digital process of test responses and a high speed in test execution. This makes it possible to integrate the complete system on one chip.

Preferred embodiments of the present invention are defined in the dependent claims.

In the signal generation system the first and second gain stages may be cascaded, and the first and second clock mapping units may be adapted for respectively controlling the individual gain of the first and second gain stages independently. This allows a precise setting of the parameters of the signal to be generated.

Furthermore, the first and second clock mapping units may be adapted for generating an array of different non-overlapped clock signals for individually controlling the gain of the first and second gain stages, thereby controlling the predetermined signal (frequency and amplitude).

The signal generator may be adapted for supplying the predetermined analog signal to a device-under-test (DUT) connectable to the signal generator, and the system may further comprise a programmable band pass filter for receiving output signals of the device-under-test and for selecting the proper harmonic from the output of the device-under-test, and a programmable gain amplifier for improving the dynamic range of the signal generation system. This allows application to a built-in self test of an analog circuit part (device under test).

The signal generation system may further comprise a first and a second gain decoder being controlled by a digital control unit, for respectively setting individually the gain to be provided by the first and second gain stages. The gain can be controlled precisely. The signal generation system may further comprise first and second multiplexers, respectively connecting the first and second gain decoders with the first and second gain stages, the multiplexers being adapted for receiving an external select signal, and for controlling the manner in which the setting information is fed from the first and second gain decoders to the first and second gain stages, respectively. Control is implemented based on an external setting.

In the signal generation system the signal generator may be supplied with a reference signal, and the amplitude of the predetermined analog signal output by the signal generator can be modified by modifying the value of the reference signal. Variation of the reference values can modify parameters of generated analog signal. High gain, precise gain settling and low distortion can be achieved.

The first and second gain stages of the signal generator may include pipelined amplifier stages based on an SC technique. Furthermore, the first and second gain stages of the signal generator may be implemented by an Gm-C technology.

The signal generation system may further include a tuning circuitry adapted for controlling the capacitance and transconductance values of the Gm-C implemented signal generator, thereby obtaining a continuous-time processing with speed advantage.

The signal generation system and the device-under-test may be implemented (integrated) on one chip. This allows the implementation of a easy self-test, having the signal generator and the device under test integrated on one chip In the method according to the second aspect of the present invention the overall gain may include gain components, and the non-overlapped clock signals may include an array of different clock signals, and the values of the gain components may be independently controlled based on the array of different clock signals.

According to a third aspect the present invention refers to a built-in self-test device for testing an analog part of a device-under-test of a mixed-signal system-on-chip, using the above signal generation system.

According to a fourth aspect the present invention refers to a method of performing a built-in self-test for testing an analog part of a device-under-test of a mixed-signal system-on-chip, using the above method of generating a predetermined analog signal as test stimuli.

The present invention is further elucidated by the following figures and examples which are not intended to limit the scope of the present invention. The person skilled in the art will understand that various embodiments may be combined.

BRIEF DESCRIPTION OF THE DRAWINGS

This and other aspects of the invention will be apparent from and elucidated with reference to the embodiments described hereinafter. In the following drawings.

DETAILED DESCRIPTION OF THE DRAWINGS

Figure 1:
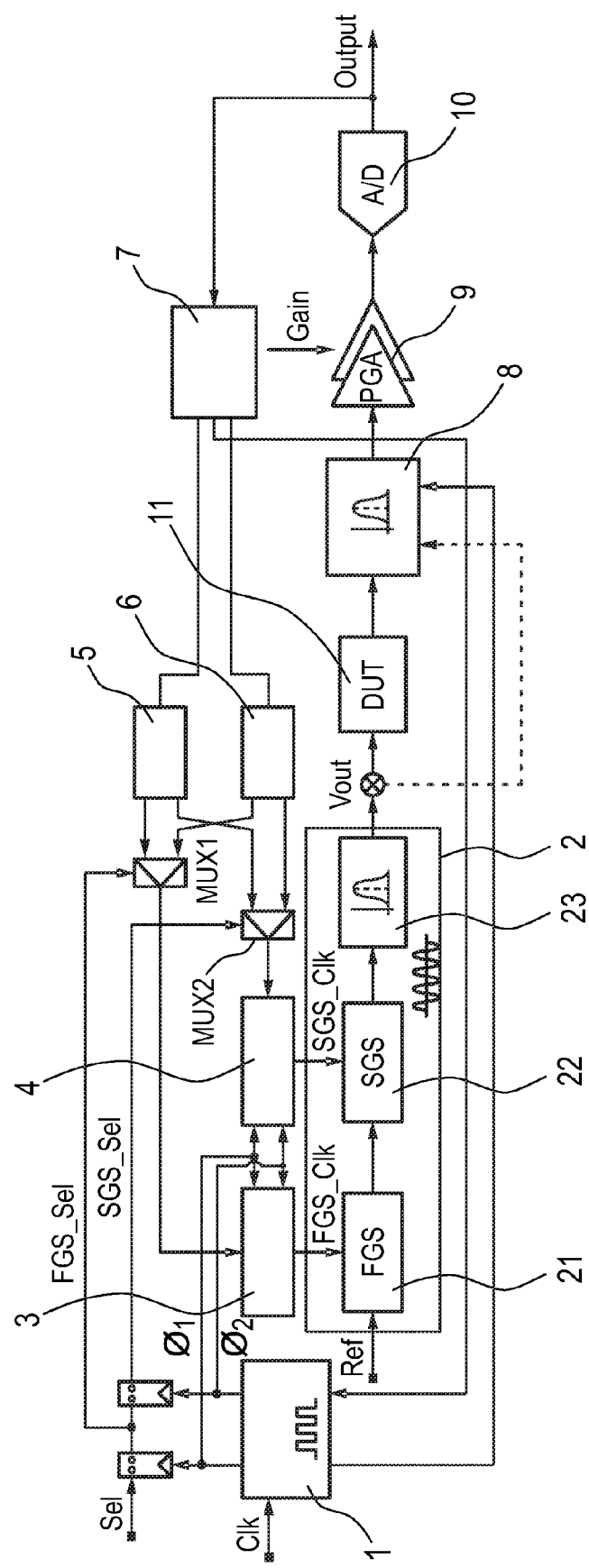
FIG. 1 shows a block circuit arrangement of an overall structure of the signal generation system according to an embodiment of the present invention.

FIG. 1 shows a block diagram of the signal generation system according to the present invention for performing an on-chip generation of discrete-time periodic analog signals for analog circuits. The signal generation system consists of a non-overlapped clock generator 1, programmable (multi-) gain stage with a time-variant filter (analog filter) forming a programmable sine wave generator 2, clock mapping blocks including a (first) FGS clock mapping block or unit 3 as well as a (second) SGS clock mapping block or unit 4, gain decoders including a (first) FGS gain decoder 5 and a (second) SGS gain decoder 6, a digital control unit 7, a band pass filter 8, an additional programmable gain amplifier (PGA) 9 being supplied with the output (signals) of the band pass filter 8 to further improve the dynamic range of the system, and a final stage for the amplitude detection and/or digitization of the PGA output, such as an analog-to-digital converter 10. The digital control unit 7 is supplied with the output of the A/D converter 10 for control purposes.

Based on an external master clock Clk, the non-overlapped clock generator 1 generates the appropriate non-overlapping clock signals for the signal generator 2 and the programmable band pass filter 8. The amplitude of the generated (analog) signal is adjustable to make it suitable for the input range of a device under tests (DUT) 11 which is connected to and supplied by the signal generator 2. The signal generator 2 has two cascaded gain stages: a first gain stage (FGS) 21 and a second gain stage (SGS) 22, each providing an individual gain components (that is, an individual gain assigned to each of the two gain stages 21 and 22) where the overall gain is the sum of the two gain components of the first gain stage 21 and the second gain stage 22. The amount of gain (i.e. the overall gain) realized by the first gain stage 21 and the second gain stage 22 is controlled by an array of non-overlapped clocks coming from the (first) FGS clock mapping block 3 and the (second) SGS clock mapping block 4, respectively. These clocks are based on the non-overlapping clocks $\emptyset_1$ and $\emptyset_2$ provided by the non-overlapped clock generator 1. It is to be noted that the signal generator preferably consists of at least the first gain stage (FGS) 21 and the second gain stage (SGS) 22 and of an analog filter 23, which preferably is a linear time-variant filter. The signal generator 2 (21, 22, 23) receives reference values in the form of reference voltages.

A select signal Sel, which may be an external signal, serves as a sequential selection signal feeding reference values to the programmable gain amplifier gain stage. Consequently, and in order to have independent (individual) control of the first and second gain stages 21 and 22, the SGS clock mapping block 3 and the SGS clock mapping block 4 respectively generate a different array of clocks FGS_Clk and SGS_Clk. Moreover, gain decoders including an FGS gain decoder 5 and an SGS gain decoder 6, generate combinational logic information on how a particular gain, that is, an individual gain component is realized in the first and second gain stages 21 and 22. The independent setting of the individual gain components in the first and second gain stages 21 and 22, respectively, is therefore activated and controlled based on said non-overlapped clock signals. Two decoders are needed for independent gain control. A state machine and two control multiplexers, that is, first and second multiplexers MUX 1 and MUX 2 control the manner in which the information (which constitutes a gain setting information individual for each gain stage 21 and 22) from the digital decoders (SGS gain decoder 5 and SGS gain decoder 6) is fed to the FGS and SGS clock mapping blocks 3 and 4, respectively.

The output signal of the signal generator 2 which represents a predetermined analog signal, preferably a sinusoidal signal, is fed to the device under test DUT 11 as high quality input stimuli (test stimuli) within a testing of the analog device under test DUT 11.

The programmable, high-Q band pass filter 8 is connected to the output side of the device under test DUT 11 and is adapted for selecting the proper harmonic components at the output of the device under test DUT 11 for magnitude response or harmonic distortion characterization.

Depending upon the characteristics of the integrated system in which the device under test DUT is embedded, and of the external test system (external tester, see Fig. X), different options can be employed for the output building block. If an analog-to-digital converter ADC, such as ADC 10, is available on-chip, the output of the programmable gain amplifier PGA 9 can directly be digitized. For general control, the digitized output of the ADC 10 is also fed to the digital control unit 7.

Accordingly, it is to be noted that an advantage of the system according to the present invention is the inherent synchronization. That is, both the stimuli frequency and the filter center frequency are controlled by the master clock. When it is swept, both the signal generator 2 and the programmable band pass filter 8 follow this adjustment. Specifically, the digital control unit 7 is connected to the non-overlapped clock generator 1. The device under test DUT 11 is incorporated, and the testing strategy does not require any re-configuration of the device under test DUT 11, and is further able to directly test frequency response related specifications thereof. Before the characterization of the device under test DUT 11, the functionality of the proposed method can be easily verified by bypassing the output of the signal generator to the band pass filter as illustrated with a dashed-line arrow in FIG. 1. This allows calibration and/or self-test of the system according to the present invention.

Figure 2:
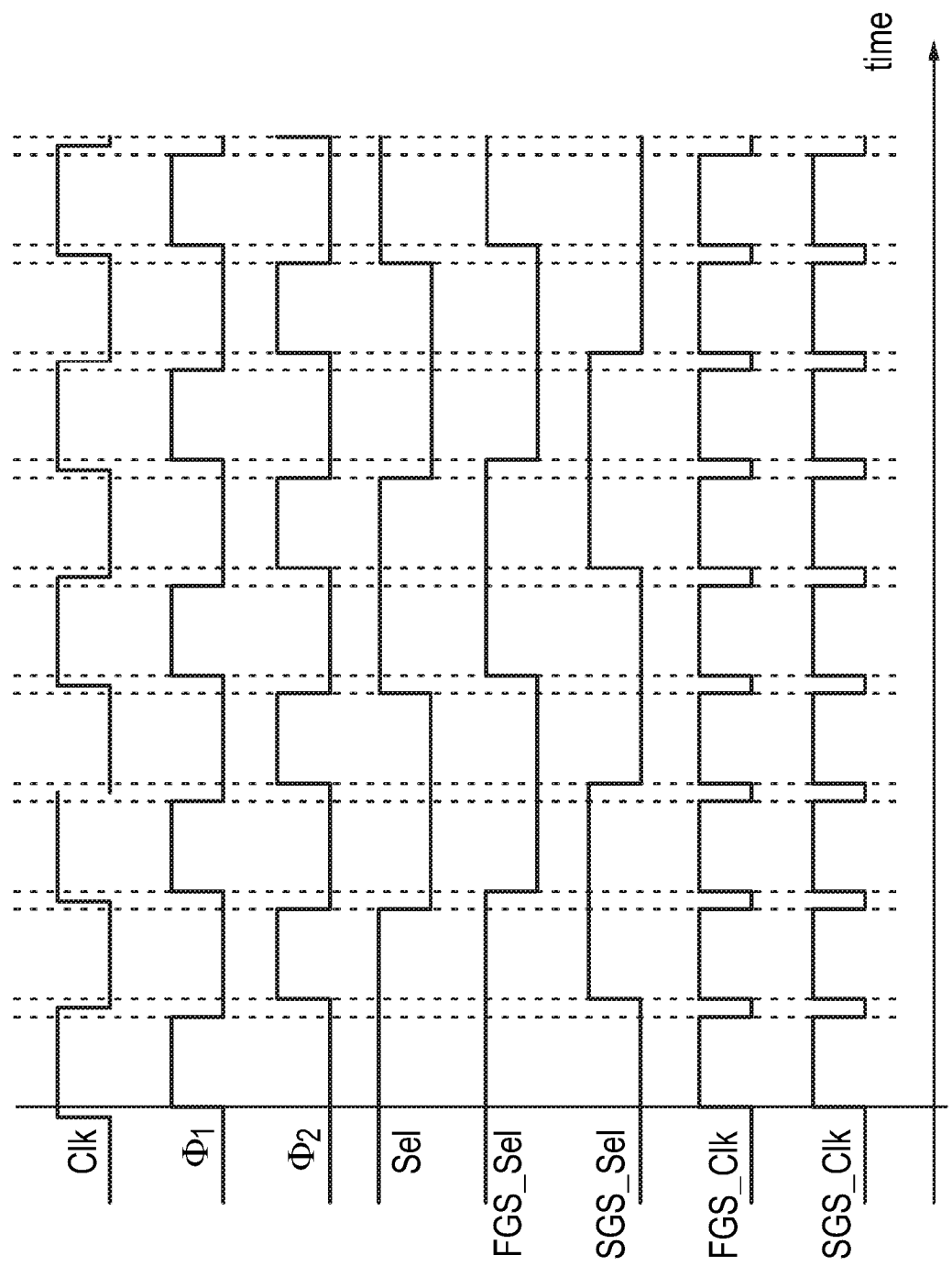
FIG. 2 shows a timing diagram of switching functions and signals of the clock circuit diagram of FIG. 1.

FIG. 2 shows a timing diagram (time charge of signals) of the processing of data through the circuit arrangement shown in the form of blocks in FIG. 1. Specifically, the processing of data through the gain stages is referred to in FIG. 2. When the signal FGS_Clk or SGS_Clk is high (high digital level), the first or second gain stage (FGS, SGS) 21 or 22 is processing data, respectively. At the clock rising edge, the first gain stage FGS 21 starts acquiring data. When the first gain stage FGS 21 starts holding, the second gain stage SGS 22 starts attaining the FGS data. When the first gain stage FGS 21 finishes holding, the second gain stage SGS 22 has fully acquired the signal from the first gain stage FGS 21.

Further signals appearing in the block circuit arrangement of FIG. 1 are exemplified in FIG. 2 with their specific timing.

Figure 3:
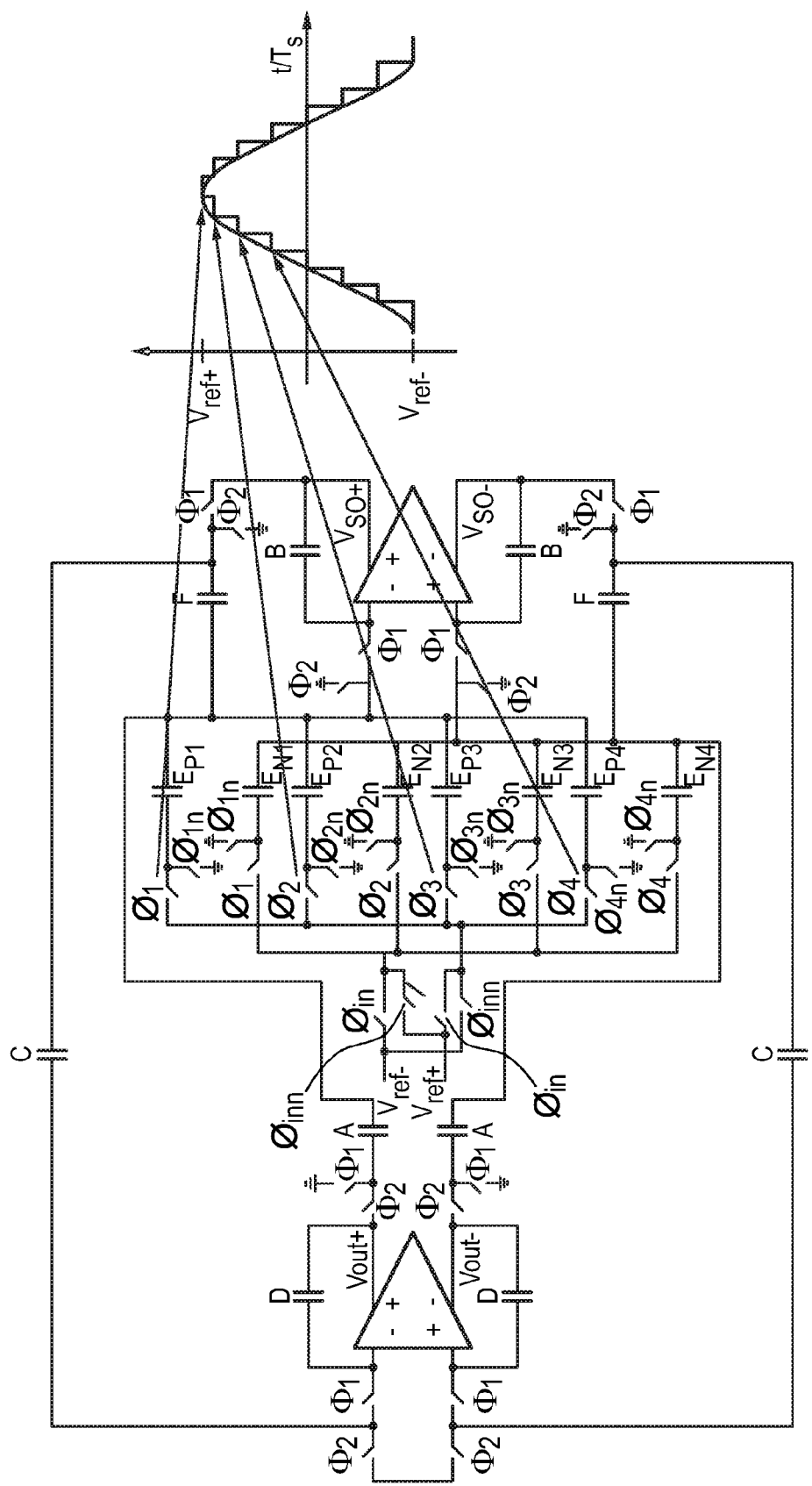
FIG. 3 shows a conceptual view of the analog signal generation of the signal generator shown in FIG. 1 implemented in SC technique.
Figure 4:
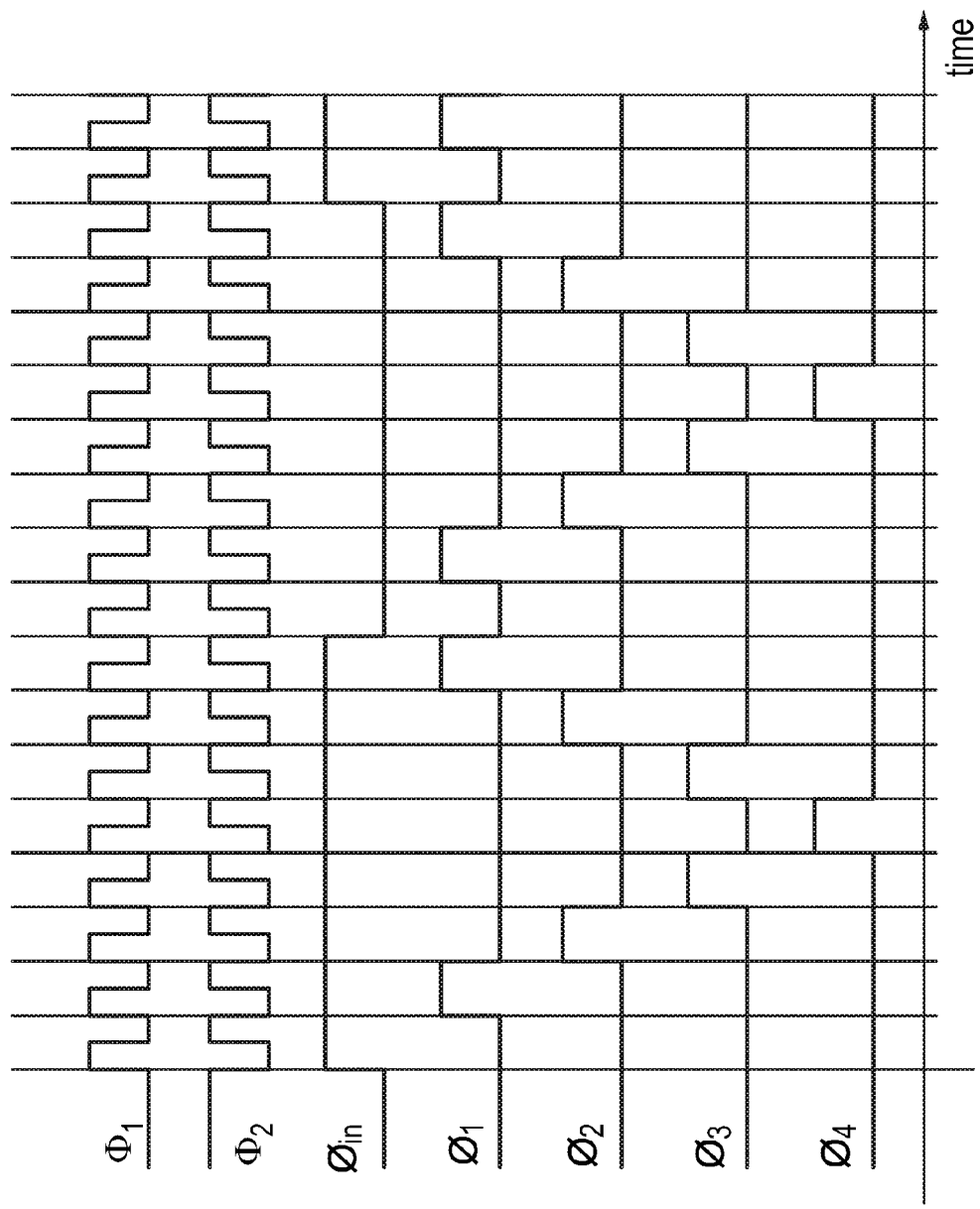
FIG. 4 shows a timing diagram of switching functions and signals occurring in the circuit arrangement shown in FIG. 3.

It is further referred to FIG. 3 which is to illustrate the concept of generating the predetermined signal, such as the sine wave generation. Specifically, FIG. 4 shows the conceptual view of the circuit arrangement based on an SC techniques. It consists of a programmable gain amplifier whose preset gain stages correspond to the value of an ideally sampled and held sine wave. The SC signal generator has four different gain settings which generate a sinusoidal signal output with 16 steps per period.

Regarding FIG. 4, in any internal clock cycle, capacitors $E_{1...4}$ absorb a charge equal to $E_{1...4}*V_{ref}$ when Ø is on and deposits the charge on the capacitor D when $\Phi_1$ is on. For the constant $V_{ref}$ value, the output of the second amplifier Vso changes by $E_{1...4}*V_{ref}/B$ every internal clock cycle.

The value of $V_{so}$ after every internal clock cycle can be written as $$V_{so}(kT_{clk}) = V_{so}[(k-1)T_{clk}] - V_{ref}[(k-1)T_{clk}] * \frac{E_{1...4}}{B}$$

where the gain of the amplifier is assumed large. The switches $Ø_1$ to $Ø_4$ are closed sequentially for one clock period to generate the four steps of the predetermined signal such as the sine wave. The charge injected by the input capacitors is integrated on capacitor B to generate the first quarter-period of the sinusoidal waveform (see right-hand side of FIG. 3).

In FIG. 3, the approximation of the sinusoidal waveform is shown in conjunction with the operation of the respective switches $Ø_1$ to $Ø_4$. Arrows in the sinusoidal waveform depicted on the right-hand side of FIG. 3 show the contribution of the operation of each of switches $Ø_1$ to $Ø_4$ to generate the first positive quarter-period of the sinusoidal waveform.

Regarding some of the signals and functions shown in FIG. 3, FIG. 4 shows a timing diagram of time-related functions of the particular switches $\Phi_1$ and $\Phi_2$, as well as switches $Ø_{in}$ and $Ø_1$ to $Ø_4$ and the signals resulting from the switching function.

Once the maximum value of the predetermined signal is obtained, the switches close sequentially for one clock period in the opposite direction (from $Ø_4$ to $Ø_1$) as illustrated in FIG. 4 to generate the second quarter-period of the sinusoidal waveform. In this case, the polarity of the reference voltage is changed through $Ø_{in}$ to generate negative and positive integration, respectively. An important advantage of this structure is that the amplitude of the sinusoidal generator output signal can easily be programmed by adjusting the reference voltages ($V_{ref+}$ and $V_{ref-}$) or using a bank of capacitors to adjust the value of B. The input of the reference voltages is depicted in FIGS. 1 and 3.

Figure 5:
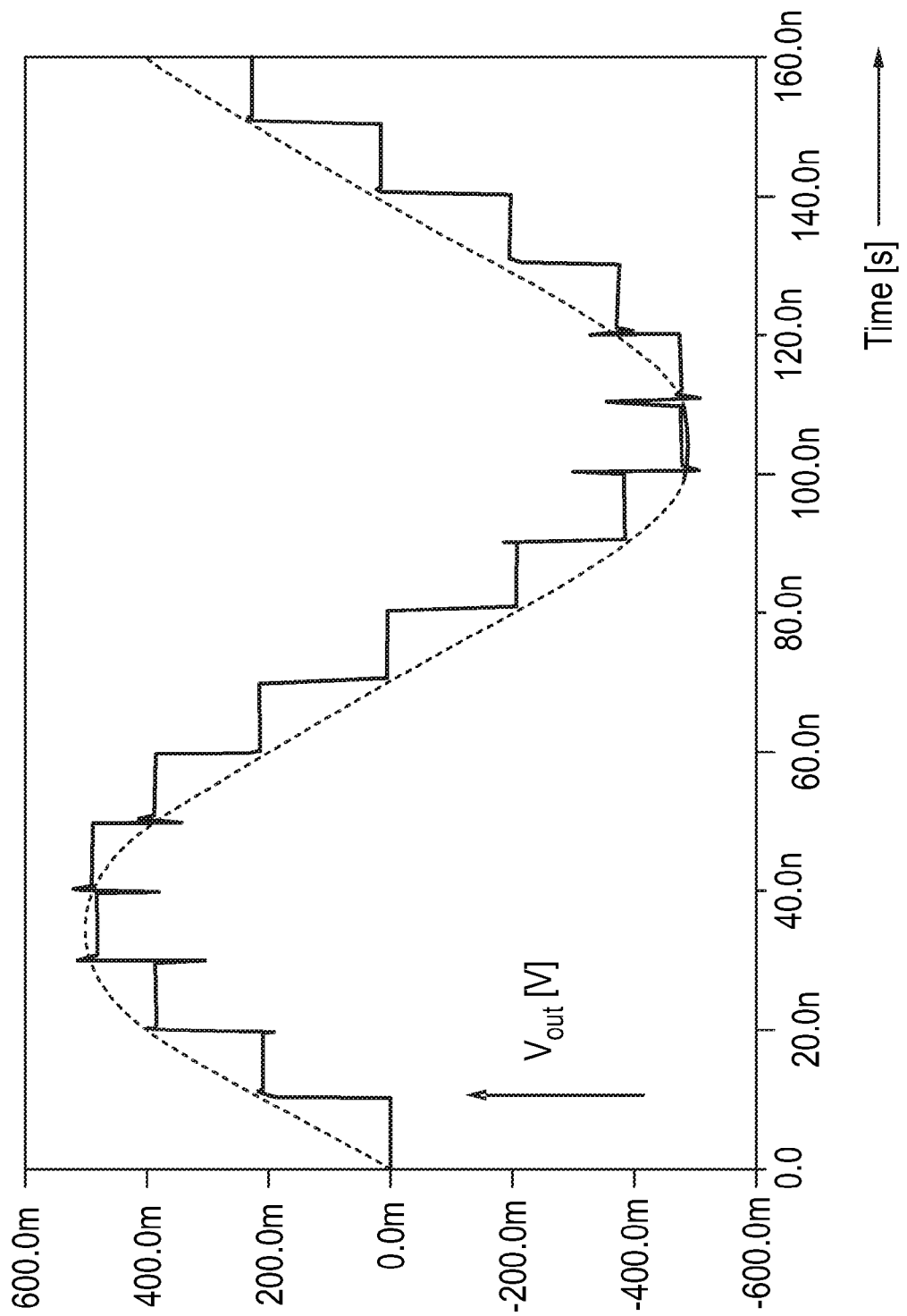
FIG. 5 shows a simulation result based on the circuit structure of indicating the stepped signal and the output signal of the signal generator in the time domain.
Figure 6:
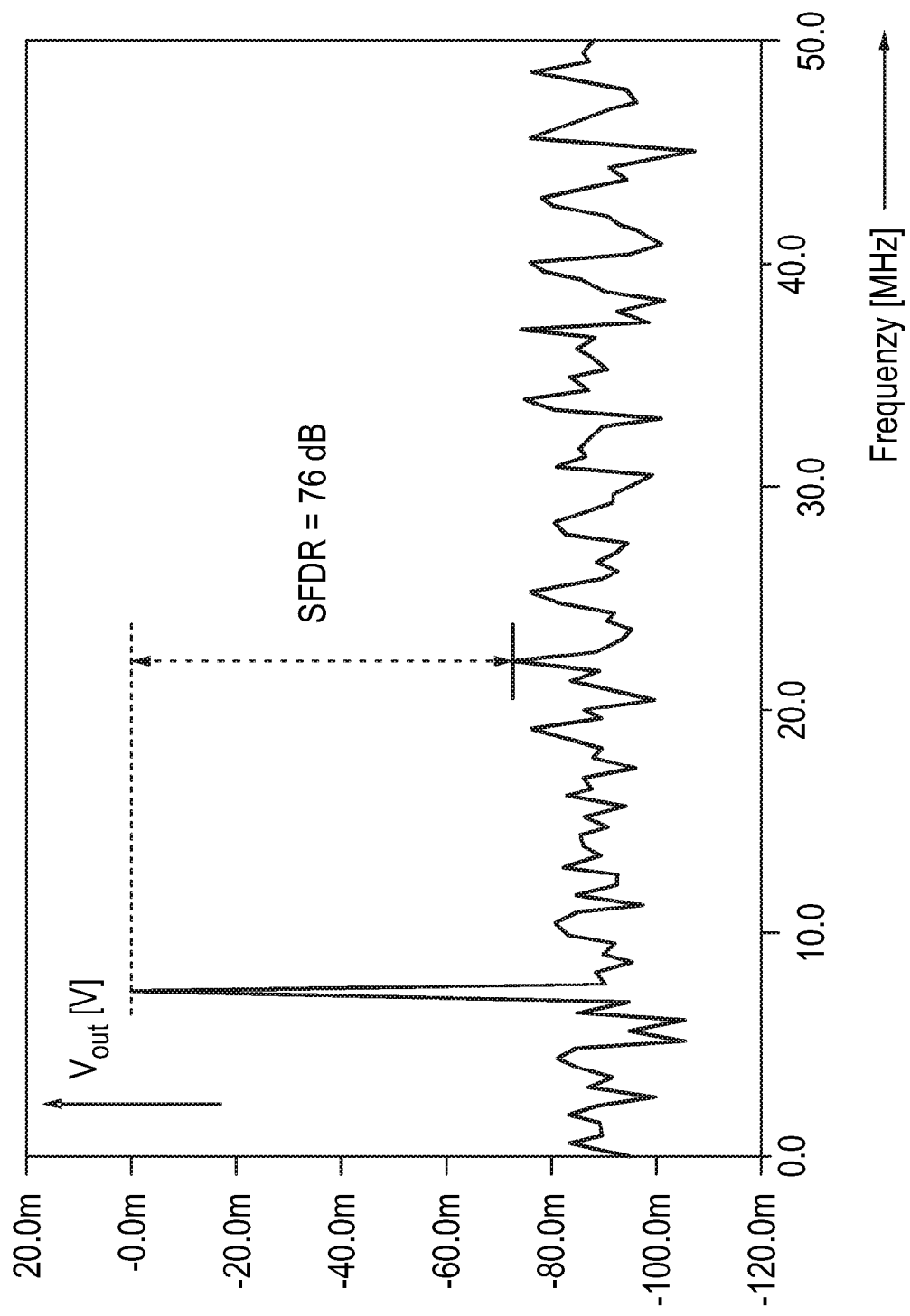
FIG. 6 shows the simulation result of the signal of FIG. 5 in the frequency domain.

A simulation of a sinusoidal waveform in conjunction with the time domain and the frequency domain are respectively shown in FIGS. 5 and 6. FIGS. 5 and 6 represent simulation results illustrating the feasibility of the system and method according to the present invention. Specifically, FIG. 5 shows the approximation of the sinusoidal waveform based on the stepped waveform in the time domain. The respective frequency components thereof are depicted in FIG. 6. The stepped waveform of FIG. 5 forms a preliminary state of the predetermined signal, such as the sinusoidal signal (analog signal, sine wave). The stepped signal basically forms a continuous time-discrete analog signal, whereas the filtered signal which corresponds to the desired (generated) predetermined signal to be fed to the DUT 11 has a continuous time-continuous amplitude.

Figure 7:
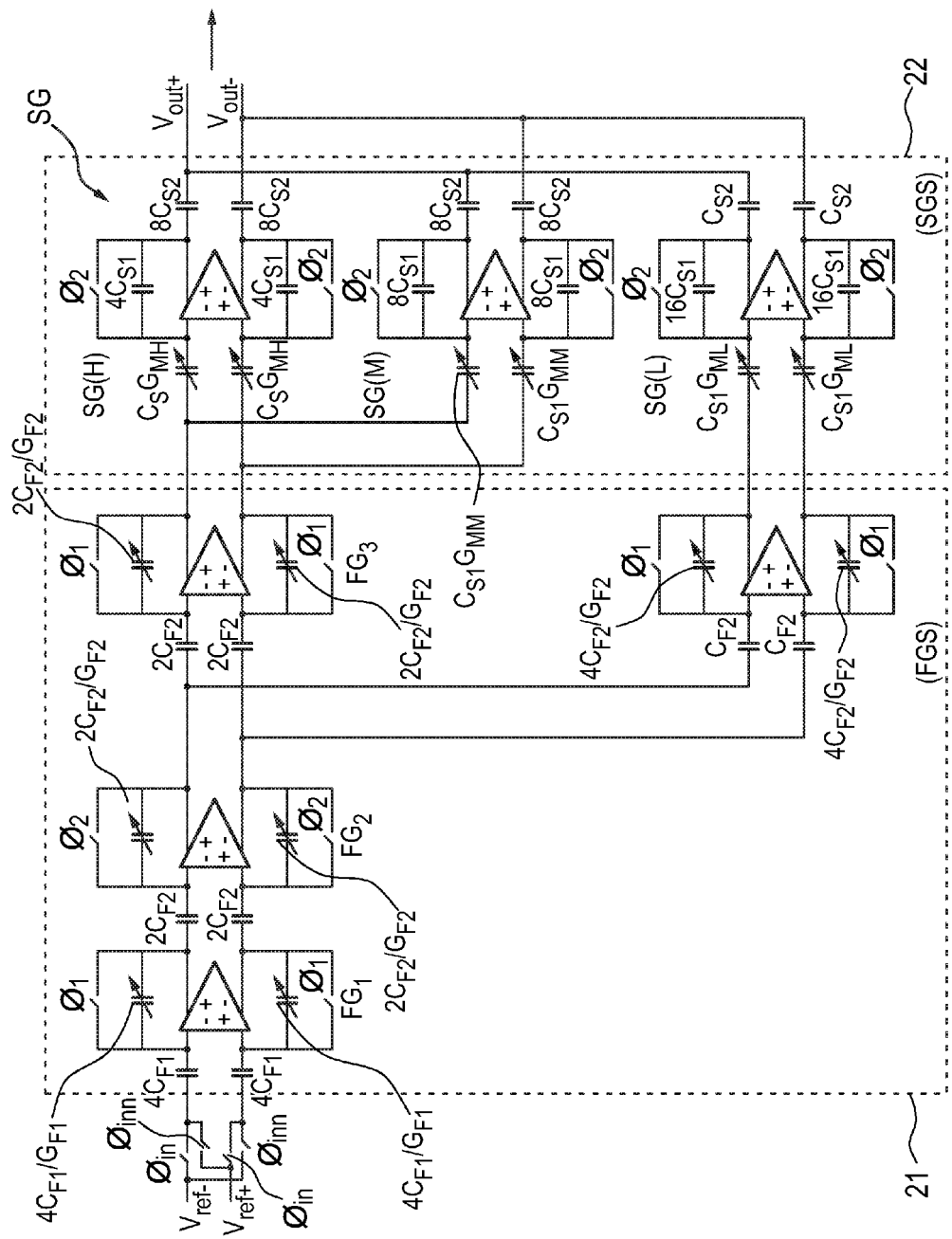
FIG. 7 shows the two stages of the signal generator realized in SC technique according to a further embodiment of the present invention.

It is now referred to the circuit arrangement shown in FIG. 7 showing the two stages of the signal generator realized in SC technique according to a further embodiment of the present invention.

In order to achieve a high gain, a precise gain settling and lower harmonic distortion, first and second gain stages 21 and 22 of the programmable sine wave generator 2 as shown in FIG. 1 and referring to the detailed arrangement of the first and second gain stages 21 and 22 as shown in FIG. 7, the circuit arrangement of FIG. 7 employs four (for example three in the first and one in the second stage) pipelined amplifier stages for high clock rate operation while maintaining low power dissipation, including seven fully differential amplifiers and high resolution capacitive banks for accurate segments definition of a discrete-time periodic analog signal (the predetermined signal).

FIG. 7 therefore shows the detailed circuit arrangement of the first and the second gain stages FGS and SGS, 21 and 22, as shown in FIG. 1 and implemented in switched-capacitor (SC) technology.

Specifically, the first gain stage FGS 21 is a cascade of three amplifiers $FG_1$, $FG_2$ and $FG_3$, as depicted in FIG. 7, while the second gain stage SGS 22 is designed with a parallel connection of three weighted gain amplifiers SG(H), SG(M) and SG(L). Each pipelined cascaded SC amplifier operates with two clocks $Ø_1$ and $Ø_2$, which are non-overlapping to each other and which are provided by the non-overlapped clock generator 1 (FIG. 1).

Figure 8:
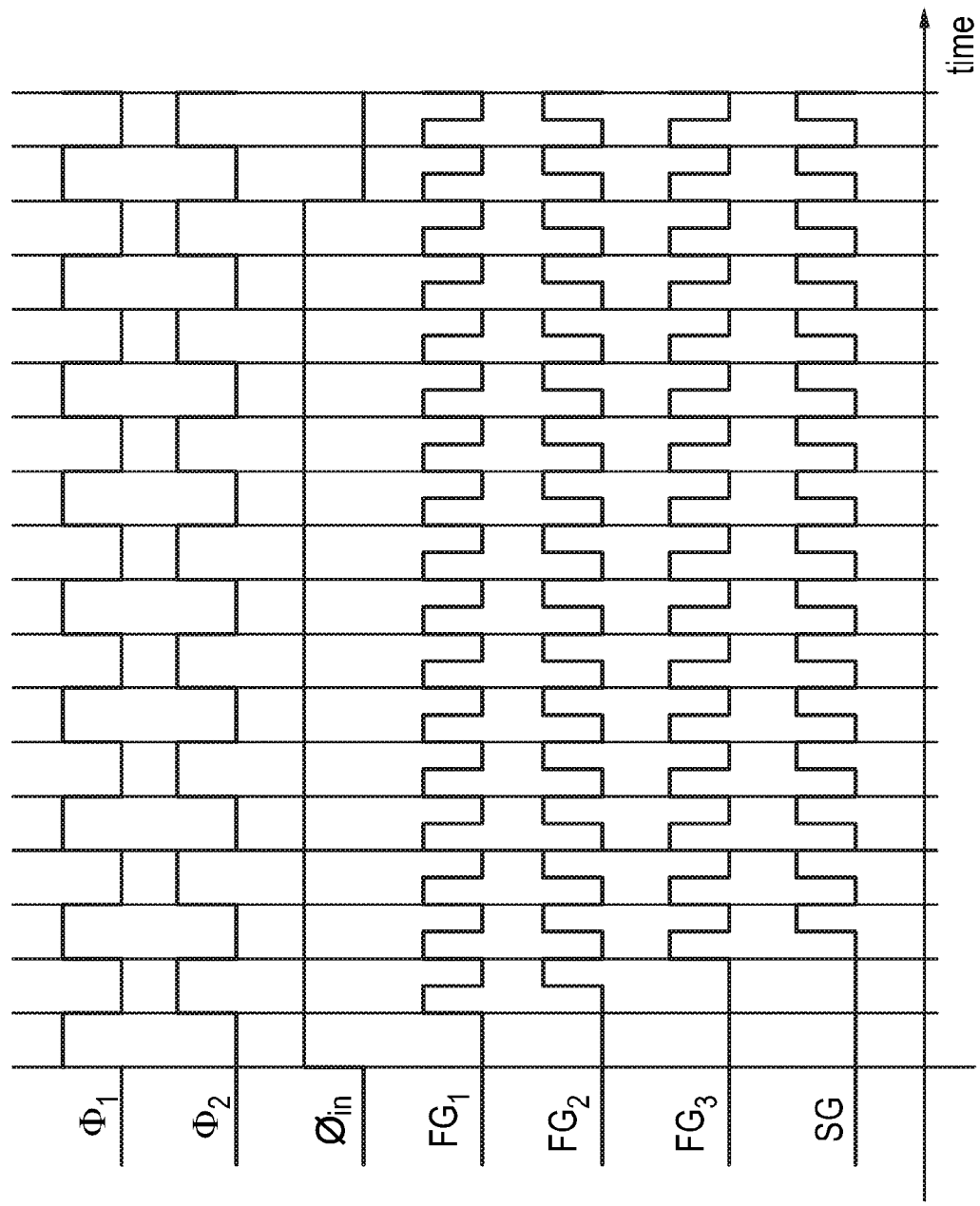
FIG. 8 shows a timing diagram of switching functions and signals occurring in the circuit arrangement of FIG. 7.

It is in this connection referred to the timing diagram of FIG. 8 showing the switching conditions of switches and corresponding signals occurring in the circuit arrangement of FIG. 7.

As can be seen from the context, in the $Ø_1$ phase, the reference signal is sampled at input capacitors of the first gain stage FGS 21 to be transferred, in the next phase, on the feedback capacitor as explained previously.

Simultaneously, the output signal of the first gain stage FGS 21 is sampled by the input capacitor of the next stage. Each stage of FIG. 7 operates in the same manner, and the overall operation with the respective signals is shown in the timing diagram of FIG. 8.

The gain in the first gain stage FGS 21 is set by the feedback capacitance. For example, in the first pipelined amplifier stage $FG_1$, the input capacitance is chosen as $4C_{F1}$, and the feedback capacitance is then given by $4C_{F1}/G_{F1}$, where $G_{F1}=1, 2$ or $4$. In the second gain stage SGS 22, the gain is set by the input capacitance. The high resolution of the gain is achieved by the parallel connection of three SC amplifiers to illustrate that, it is to be considered, for example, the GA(H) stage, where the input capacitance is chosen as $C_{s1}*G_{MH}$ with $G_{MH}=2, 3, \ldots, 7$, so that the gain is set to $CS1*G_{MH}/4C_{S1}=G_{MH}/4$. Thus, the individual gain components, that is, the gain of each of the first and second gain stages is controlled or set individually and independently. The overall gain obtained by the independent and individual setting is the sum of the individual gains of each of the first and second gain stages 21 and 22.

A signal in a switched-capacitor circuit remains continuous in voltage. It is also in fact a discrete-time signal, since it requires sampling in the time domain. Because of this time-domain sampling, the clock rate must always be at least twice that of the highest frequency being processed to eliminate aliasing. As a result, switched-capacitor circuits are limited in their ability to process high-frequency signals.

On the other hand, continuous-time processing (such as Gm-C technology) has signals that remain continuous in time and have analog signal levels. Since no sampling is required, a continuous-time processing has a speed advantage over their switched-capacitor (SC) counterpart. However, the need for a tuning circuitry because their filter coefficients are determined by the product of two dissimilar elements, such as capacitance and transconductance values, restrict continuous-time filters to high-speed by otherwise lower-performance applications.

Figure 9:
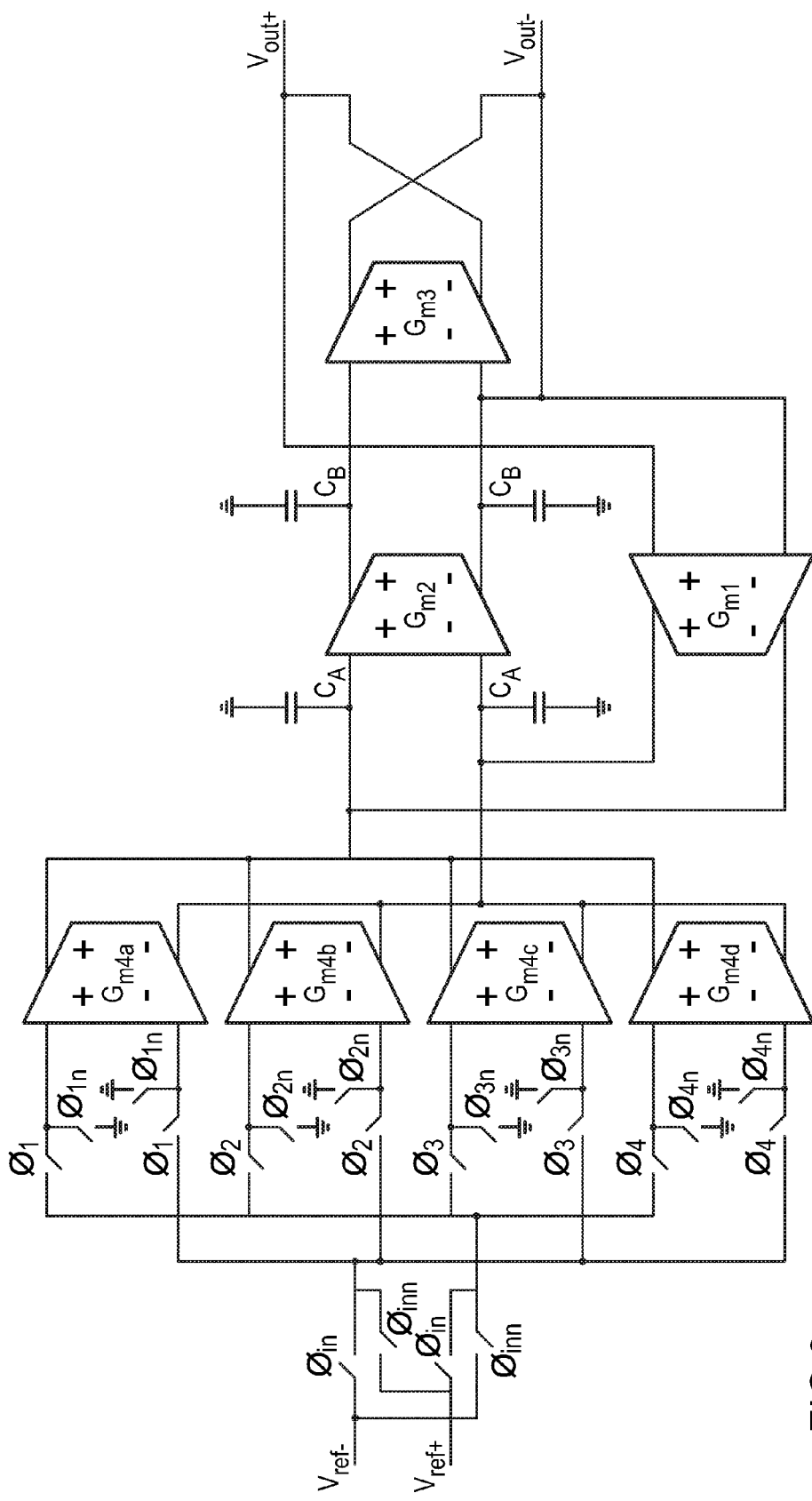
FIG. 9 shows a circuit arrangement wherein the signal generator shown in FIG. 1 is implemented in Gm-C technique according to a further embodiment of the present invention.

In this connection, FIG. 9 according to a further embodiment of the present invention illustrates a Gm-C realization of the signal generator 2 (FIG. 1) and specifically of the proposed analog signal generation shown in FIG. 3. It is to be noted that the signal generation principle in both cases is the same. In the further embodiment of the present invention Gm-C technology transconductance cells are used to realize the function of the circuitry (transconductance $g_m$). That is, the approximated stepped sinusoidal waveform as shown in FIG. 3 applies for output of the circuit arrangement according to FIG. 9.

Figure 10:
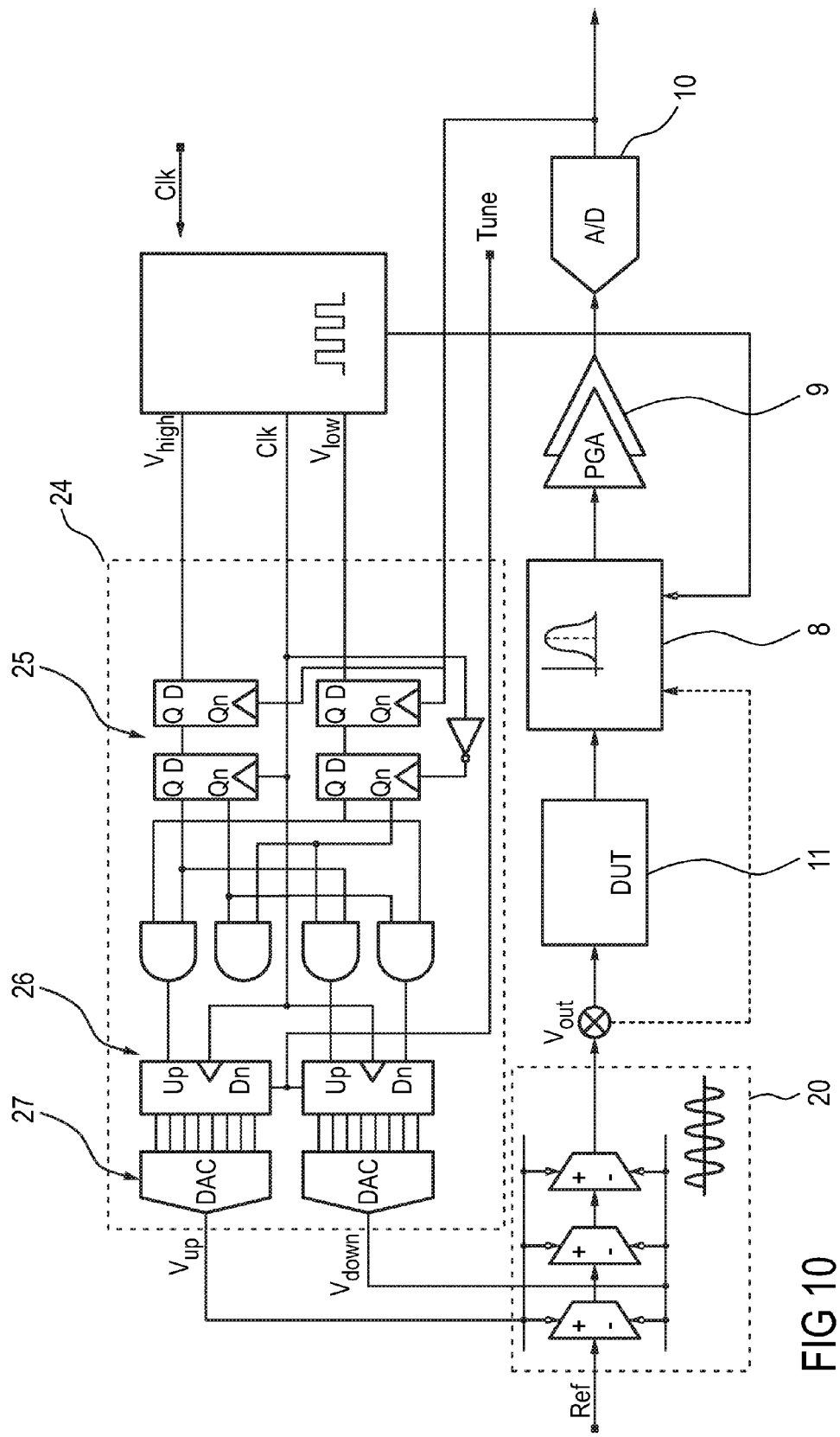
FIG. 10 shows the block structure of a circuit arrangement for controlling the signal generator in Gm-C technique by means of a tuning circuitry.

Referring to FIG. 10, this figure shows a complete tuning system (tuning circuitry) for the Gm-C realization of the proposed analog signal generation. The tuning system 24 includes a tuning circuit 25, counters 26 and corresponding DACs 27 and is adapted for controlling the capacitance and transconductance values of the Gm-C implemented circuit components.

A low-frequency clock signal Clk determines the tuning cycles in which the filter's frequency is switched between referenced frequencies. The signals $V_{high}$ and $V_{low}$ are delayed clocks, whereas $V_{up}$ and $V_{down}$ are control voltages for controlling a programmable sine wave generator 20 of FIG. 10 which basically corresponds to the signal generator 2 of FIG. 1. The filter is calibrated when the tuning signal Tune is set to a high level. Normal operation of the filter (i.e. processing the signals) is resumed when the tuning signal Tune is set to a low level, where the tuning voltages $V_{up}$ and $V_{down}$ are held at their proper values. Since the two reference frequencies cannot be applied simultaneously, the frequency of the filter changes periodically between reference frequencies. When one reference frequency is applied to the filter, the low pass output is compared with the voltage of the signal $V_{low}$. The low pass output is connected to the clock input of the flip-flops of the tuning circuit, whereas the reference is applied to the D input. Assuming that a transition occurs at the rising edge of the clock, the flip-flop stores high output level if the low pass delay is more than $V_{low}$, otherwise the output is zero. In the next phase, when the filter input is at different reference frequency, a delay of the low pass output is compared with the signal $V_{HIGH}$.

The first set of D flip-flops compares the low pass phase with the appropriate references, and the output is stored in the following D flip-flops at the end of each cycle. Corresponding counters are updated by the clock signal Clk and are enabled only when the tuning signal Tune is of a high level.

According to FIG. 9, the programmable sine wave generator 20 includes Gm-C cells (transconductance cells) for data processing of signals, that is, for generating and filtering the sinusoidal waveform forming the predetermined signal.

FIG. 10 further includes components such as the device under test 11, the programmable band pass filter 8, the programmable gain amplifier 9 and the A/D-converter 10 in conjunction with the digital control unit 6 which basically have the same function as the circuit components described in conjunction with FIG. 1.

The above described components of the signal generation system can be operated based on a corresponding signal generation method. It is in this connection referred to FIG. 11.

Figure 11:
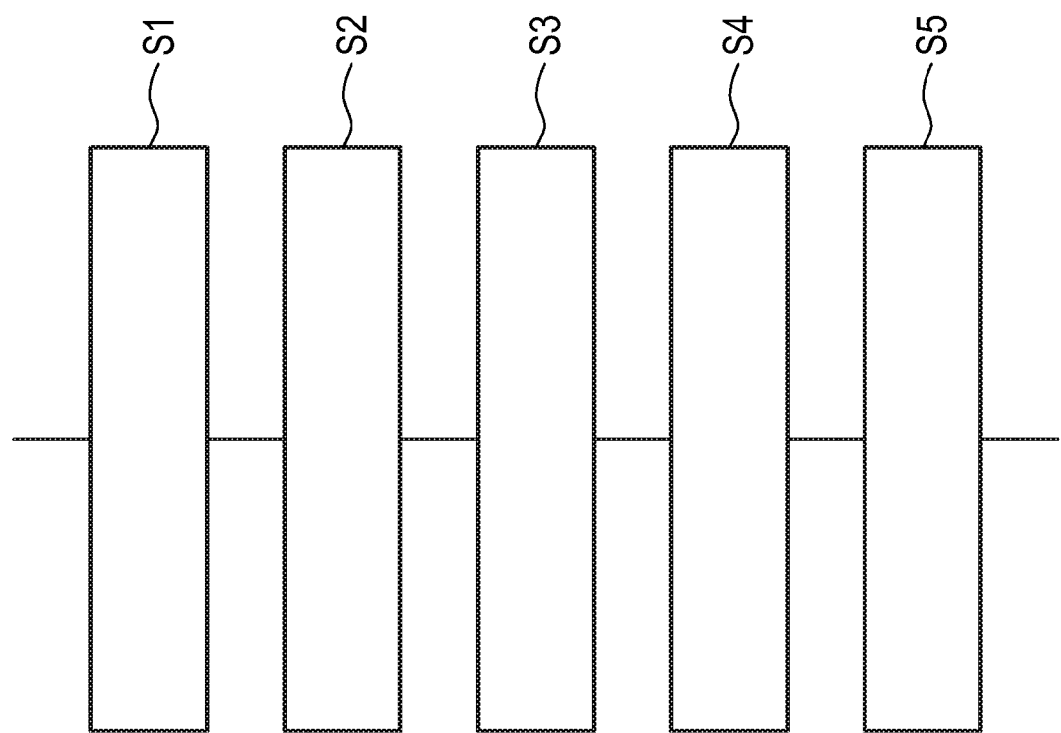
FIG. 11 shows a portion of a flow chart covering the signal generation method according to the present invention.
Figure 12:
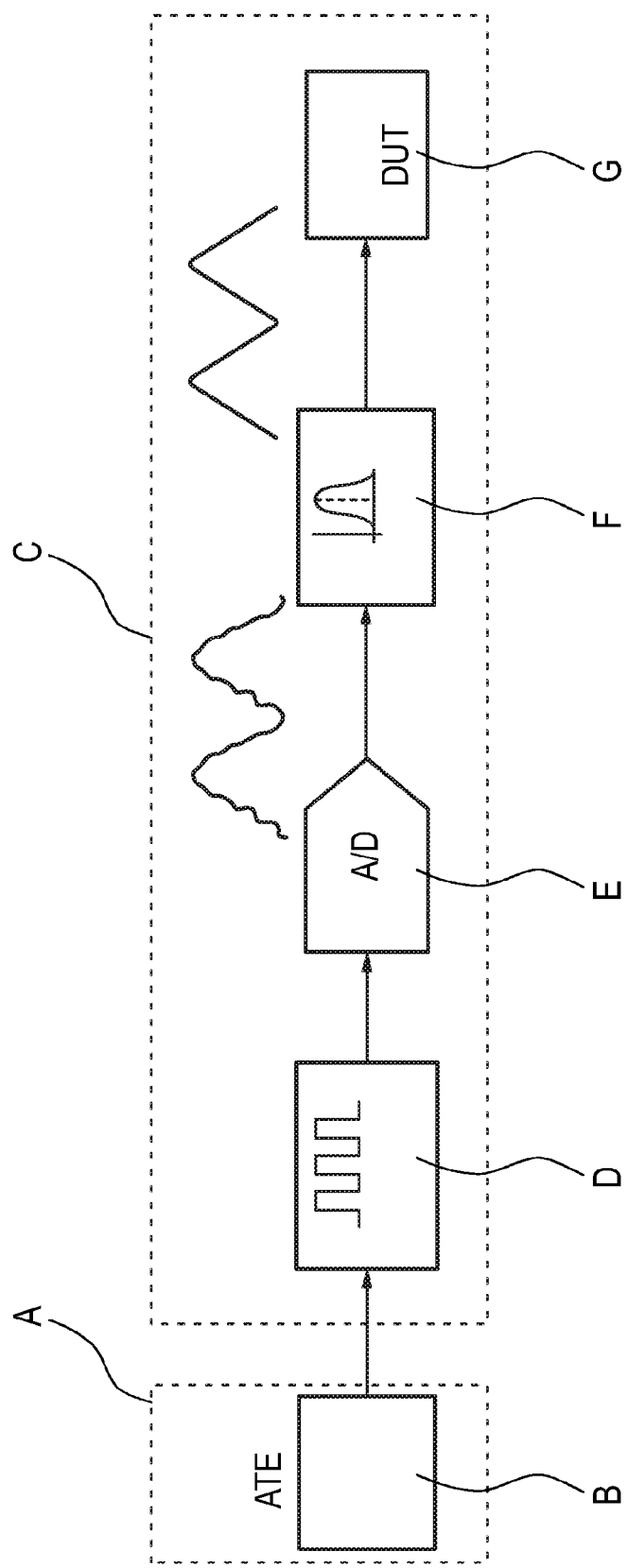
FIG. 12 shows the general arrangement of an on-chip digital based analog signal generator.

The signal generation method which represents a second aspect of the present invention is directed to a method of generating the predetermined analog signal preferably the sine wave or sinusoidal signal as test stimuli (analog test signals) for the device under test DUT 11. The method comprises the following steps as shown in FIG. 11. A first step S1 concerns the generating, on the basis of an external clock signal, of a predetermined clock signal. A second step S2 refers to generating, based on the predetermined clock signal non-overlapped clock signals. In a third step S3 an overall gain of a signal generator based on the non-overlapped clock signals is provided and a stepped analog signal is output. A fourth step S4 concerns the filtering of the stepped analog signal and outputting of the predetermined analog signal. According to a fifth step S5 the overall gain of the signal generator is controlled on the basis of the non-overlapped clock signals.

In summary, the present invention therefore refers to an analog sine wave signal generator with minimal circuitry resources and a corresponding signal generation method. It is based on a linear time-variant filter that gives a high quality sign signal in response to a DC input. The proposed architecture has attributes of digital programming and control capability, and due to the minimal circuitry resources reduces area overhead in an integrated circuit. This makes it suitable for any built-in self-test BIST applications. That is, the signal generation system according to the present invention can be used for generating the stimuli for a built-in self-test BIST of an analog circuit part being implemented on the same chip. The integration involves integration of the signal generation system and the device under test DUT 11. The predetermined signal, such as the sinusoidal signal (sine wave) is fed to the DUT 11 and the output thereof is evaluated. The generated analog signal can be used in a BIST concept for testing analog circuit parts. The built-in self-test is therefore implemented on-chip. Therefore, according to a third aspect the present invention it is therefore referred to a built-in self-test device for testing an analog part of a device-under-test of a mixed-signal system-on-chip, using the above signal generation system. And, according to a fourth aspect the present invention it is referred to a method of performing a built-in self-test for testing an analog part of a device-under-test of a mixed-signal system-on-chip, using the above method of generating a predetermined analog signal.

APPLICATIONS OF THE INVENTION

The increased costs associated with testing complex mixed-signal electronic systems are identified in the SIA roadmap for semiconductors as one of the key problems for actual and future mixed-signals system on chips (SoCs). The increasing analog nature of such systems represents the main bottleneck in this line. Traditional test methods for analog circuits rely in functional tests, demanding high quality input stimuli, and high data volume acquisition and processing capability. Moreover, the sensitivity of analog cores at the test conditions and process variations make their test a difficult task which requires expensive automatic test equipments. Built-in self-test schemes are well accepted techniques which overcome some of the most processing problems cited above, by moving part of the required test resources from the automatic test equipment ATE to the chip.

The present invention therefore intends to facilitate the on-chip evaluation and generation of periodic signals, which are of undoubted interest from this point of view. It has a wide potential of applications in the field of mixed-signal testing as most of these systems (filters, ADCs, DACs, signal conditioners, etc.) can be characterized and tested (frequency domain specifications, linearity, etc.) using this kind of generated stimuli. Economic considerations are only one of the advantages. Other advantages include low speed digital interface needs with automatic test equipment ATE, programming capability, robustness against environmental noise and process variations, and low design effort and area overhead. The present invention therefore refers to an implementation of a variable gains step-wide switched-capacitor (SC) amplifier (VGA), wherein each gain step represents a value of a sampled and hold signal, plays the role of the digital-to-analog converter. Both the amplitude and frequency of the signal can easily be controlled by a DC input voltage and the clock frequency, respectively, together with the simplicity and robustness of the logic and the SC circuitry.

According to the present invention the circuitry is improved by the use of a linear time-variant filter. This leads to merging both operations, that is, signal generation and filtering in the filter itself. The circuitry and control concept according to the present invention maintains the attribute of digital control, programmability and robustness, and reduces significantly the area overhead with respect to prior art approaches. Furthermore, to tackle the limited frequency range and signal quality accuracy inadequateness, the present invention offers a fully differential pipelined amplifier stages solution. See in this connection FIG. 7, wherein a high gain, a precise gain settling and a lower harmonic distortion required to test high resolution devices such as >10 bit analog-to-digital converters is achieved.

Furthermore, according to further aspect, a continuous-time solution (Gm-C implementation) for very high frequencies is provided (see FIG. 9) in conjunction with the tuning circuitry necessary for this implementation (see FIG. 10). Furthermore, the testing strategy according to the present invention does not require any device-under-test (DUT) reconfiguration and is able to directly test frequency response related specifications. The complete arrangement allows integration or implementation of the signal generation system as well as the device under test on chip.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope.

The invention claimed is:

1. A signal generation system configured to generate a predetermined analog signal, the signal generation system comprising:
   a clock generator configured to generate, on the basis of an external clock signal, a predetermined clock signal;
   a signal generator comprising a first gain stage and a second gain stage configured to provide an overall gain of said signal generator, and output a stepped analog signal;
   an analog filter configured to filter said stepped analog signal output by said second gain stage, output said predetermined analog signal, and supply the predetermined analog signal to a device-under-test connectable to the signal generator;
   a first and a second clock mapping unit configured to receive said predetermined clock signal, and respectively supply, to said first and second gain stages, non-overlapped clock signals, wherein an amount of gain provided by said first and second gain stages is controlled by said non-overlapped clock signals; and
   a programmable band pass filter that is configured to receive output signals of the device-under-test.

2. The signal generation system according to claim 1, wherein said first and second gain stages are cascaded, and said first and second clock mapping units are configured to respectively control each respective amount of gain of said first and second gain stages independently.

3. The signal generation system according to claim 2, wherein said first and second clock mapping units are configured to generate an array of different non-overlapped clock signals for individually controlling the amount of gain of said first and second gain stages.

4. The signal generation system according to claim 1, wherein the programmable band pass filter to select a proper harmonic from the output signals of the device-under-test, and the signal generation system further comprises:
   a programmable gain amplifier configured to improve a dynamic range of the signal generation system.

5. The signal generation system according to claim 4, further comprising:
   a first and a second gain decoder, controlled by a digital control unit, that are configured for respectively setting individually the amount of gain to be provided by said first and second gain stages.

6. The signal generation system according to claim 5, further comprising:
   first and second multiplexers, respectively connecting said first and second gain decoders with said first and second gain stages, the multiplexers being configured to receive an external select signal, and control how setting information is fed from the first and second gain decoders to the first and second gain stages, respectively.

7. The signal generation system according to claim 1, wherein said signal generator is supplied with a reference signal, and an amplitude of said predetermined analog signal output by said signal generator can be modified by modifying a value of said reference signal.

8. The signal generation system according to claim 1, wherein said first and second gain stages of said signal generator include pipelined amplifier stages based on an Switched Capacitor (SC) technique.

9. The signal generation system according to claim 1, wherein said signal generation system and said device-under-test are implemented on one chip.

10. A built-in self-test device for testing an analog part of a device-under-test of a mixed-signal system-on-chip, using the signal generation system according to claim 1.

11. The signal generation system according to claim 1, wherein the first gain stage comprises a cascade of three amplifiers.

12. The signal generation system according to claim 1, wherein the second gain stage comprises a parallel connection of three weighted gain amplifiers.

13. A signal generation system configured to generate a predetermined analog signal, the signal generation system comprising:
   a clock generator configured to generate, on the basis of an external clock signal, a predetermined clock signal;
   a signal generator comprising a first gain stage and a second gain stage configured to provide an overall gain of said signal generator, and output a stepped analog signal;
   an analog filter configured to filter said stepped analog signal output by said second gain stage, output said predetermined analog signal, and supply the predetermined analog signal to a device-under-test connectable to the signal generator;

a first and a second clock mapping unit configured to receive said predetermined clock signal, and respectively supply, to said first and second gain stages, non-overlapped clock signals, wherein an amount of gain provided by said first and second gain stages is controlled by said non-overlapped clock signals, wherein said first and second gain stages of said signal generator are implemented by a Transconductance-Capacitance (Gm-C) technology.

14. The signal generation system according to claim 13, further comprising:

tuning circuitry configured to control capacitance and transconductance values of the Gm-C implemented signal generator.

15. The signal generation system of claim 13, further comprising:

a programmable band pass filter that is configured to receive output signals of the device-under-test.

16. The signal generation system of claim 13, further comprising:

a tuning circuit;

counters; and respective digital to analog converters (DACs).

17. The signal generation system of claim 13, further comprising:

first and second sets of D flip flops.

18. A method of generating a predetermined analog signal, comprising:

generating, based on an external clock signal, a predetermined clock signal;

generating, based on said predetermined clock signal, non-overlapped clock signals;

providing an overall gain of a signal generator based on said non-overlapped clock signals;

outputting a stepped analog-signal;

filtering said stepped analog signal;

outputting said predetermined analog signal;

controlling said overall gain of said signal generator based on said non-overlapped clock signals;

supply the predetermined analog signal to a device-under-test connectable to the signal generator; and receiving, with a programmable band pass filter, output signals of the device-under-test.

19. Method according to claim 18, wherein said overall gain includes gain components, said non-overlapped clock signals include an array of different clock signals, and values of said gain components are independently controlled based on said array of different clock signals.

20. A method of performing a built-in self-test for testing an analog part of a device-under-test of a mixed-signal system-on-chip, using the method of generating a predetermined analog signal according to claim 19.

* * * * *